United States Patent [19]

Quist

[11] Patent Number: 4,551,690
[45] Date of Patent: Nov. 5, 1985

[54] AUTOMATIC TUNING CIRCUIT FOR USE IN AN ULTRASONIC APPARATUS

[75] Inventor: Eric Quist, Roxbury, Conn.

[73] Assignee: Branson Ultrasonics Corporation, Danbury, Conn.

[21] Appl. No.: 681,085

[22] Filed: Dec. 13, 1984

Related U.S. Application Data

[63] Continuation of Ser. No. 359,214, Mar. 18, 1982, abandoned.

[51] Int. Cl.[4] .............................................. H03L 7/00
[52] U.S. Cl. ............................... 331/36 L; 331/117 R; 331/181; 310/316
[58] Field of Search .......................................... 331/36

[56] References Cited

U.S. PATENT DOCUMENTS

| | | | |
|---|---|---|---|
| 3,263,184 | 7/1966 | French et al. ........................ | 331/181 |
| 3,432,691 | 3/1969 | Shoh .................................... | 310/316 |
| 3,946,280 | 3/1976 | Quist ............................ | 330/207 P X |
| 4,371,816 | 2/1983 | Wieser ............................. | 310/316 X |

FOREIGN PATENT DOCUMENTS

| | | | |
|---|---|---|---|
| 268447 | 7/1963 | Australia ........................... | 331/36 L |
| 2815434 | 10/1978 | Fed. Rep. of Germany ...... | 331/158 |

*Primary Examiner*—Eugene R. LaRoche
*Assistant Examiner*—Robert J. Pascal
*Attorney, Agent, or Firm*—Ervin B. Steinberg; Philip J. Feig

[57] ABSTRACT

An automatic tuning circuit is provided for adjusting the frequency and phase of an oscillatory circuit in a power supply used for providing high frequency electrical energy to an electroacoustic converter. The oscillatory circuit includes an electrically variable inductance means in a feedback loop coupled between the output and an input of the oscillatory circuit and a switching device. The phase relationship of a signal indicative of the voltage across the switching device and a signal indicative of the state of the switching device and hence the current through the switching device is monitored. The inductance of the variable inductance means is adjusted responsive to the phase relationship of the signals indicative of voltage and current through the switching device for maintaining the two signals in phase during operation of the oscillatory circuit.

5 Claims, 3 Drawing Figures

AUTOMATIC TUNING CIRCUIT FOR USE IN AN ULTRASONIC APPARATUS

This is a continuation of application Ser. No. 359,214, filed 03/18/82, now abandoned.

BACKGROUND OF THE INVENTION

This invention relates to a circuit for automatically adjusting the frequency and the phase of an oscillatory circuit electrical signal useful for energizing an electroacoustic converter and, more specifically, concerns an electrical circuit for maintaining an oscillatory circuit of an ultrasonic apparatus tuned for optimum operation.

Ultrasonic energy has found wide use in industry for cleaning, welding, soldering, treating materials, homogenizing, dispersing, disrupting microbiological cells and the like. The sonic or ultrasonic energy necessary to accomplish such tasks is generated most often by means of an electroacoustic converter which converts high frequency electrical energy into mechanical vibration. When the mechanical or acoustic energy so produced is concentrated and increased in amplitude, by means of a suitably dimensioned horn to provide high power densities per unit area, such power is eminently suited for the ultrasonic processes described above. A typical electroacoustic converter is described in U.S. Pat. No. 3,524,085, issued to A. Shoh, entitled "Sonic Transducer" and dated Aug. 11, 1970. For a discussion on dimensioning horns see, for instance, the book entitled "Ultrasonic Engineering" by Julian R. Frederick, John Wiley & Sons, Inc., New York, N.Y., 1965, pp. 87 to 103.

One of the basic requirements for operating a high power sonic converter is that the converter and horn assembly be dimensioned to be mechanically resonant at a predetermined frequency usually in the range between about 1 kHz and 100 kHz and usually at a frequency of 20 kHz or 40 kHz. Maximum energy transfer from the electrical oscillator (power supply) to the mechanical system (converter and horn) occurs at the resonant frequency. The mechanical system may be resonant at frequencies close to but different from the predetermined resonant frequency. When the electrical and mechanical systems operate at frequencies other than the predetermined frequency, component failure in the power supply is a likely occurrence and the efficiency of the energy transferred from the power supply to the mechanical system is reduced. Overload circuits are generally provided to turn the power supply off in the event of operation at a frequency which differs from the predetermined frequency. A typical overload circuit is described in U.S. Pat. No. 3,946,280, issued to E. Quist, entitled "Overload Protection Circuit", dated Mar. 23, 1976.

In prior art arrangements, the power supply is mechanically tuned by providing an operator adjustment in conjunction with the viewing of a power meter. The tuning adjustment, typically, involves the positioning of a movable core within an inductor to thereby change the circuit inductance, and hence the resonant frequency of the power supply. Such an arrangement is currently found in commercially available ultrasonic welders, such as the Model 800 ultrasonic welder manufactured by Branson Sonic Power Company, Danbury, Conn. While this technique is very successful, mechanical retuning is required each time the electroacoustic converter or horn is replaced.

The present invention obviates the requirement for mechanically tuning the system by providing an automatic tuning circuit which maintains the oscillating frequency and phase of the power supply to correspond to the predetermined frequency of the converter and horn assembly. The phase of two electrical signals generated within the power supply are compared with one another. In the preferred embodiment, the first signal compared is the collector voltage signal and the second signal is the base voltage signal of one of the transistors of the oscillatory circuit comprising a portion of the power supply. A control signal is generated having an amplitude commensurate with the magnitude of the phase difference between the two signals and a polarity commensurate with which one of the two signals leads the other. The control signal is processed for providing an adjustment signal which is used to automatically vary the inductance of an electrically variable inductor in the feedback path of the oscillatory circuit. The use of an electrically variable inductor in lieu of the heretofore employed mechanically adjustable inductor in the feedback loop of a power supply and the generation of an adjustment signal for varying the inductance comprises the present invention.

A principal object of the present invention is, therefore, the provision of an automatic tuning circuit in an oscillatory circuit used for driving an electroacoustic converter, the tuning circuit adjusting the phase of a feedback signal from the output transformer energizing the converter to the input transformer of the oscillatory circuit.

Another object of the present invention is the provision of an automatic tuning circuit for maximizing energy transferred from a power supply to an electroacoustic converter at a predetermined frequency.

Further and still other objects of the present invention will become more clearly apparent from the following description when read in conjunction with the accompanying drawings.

DETAILED DESCRIPTION OF THE INVENTION

Figure 1:
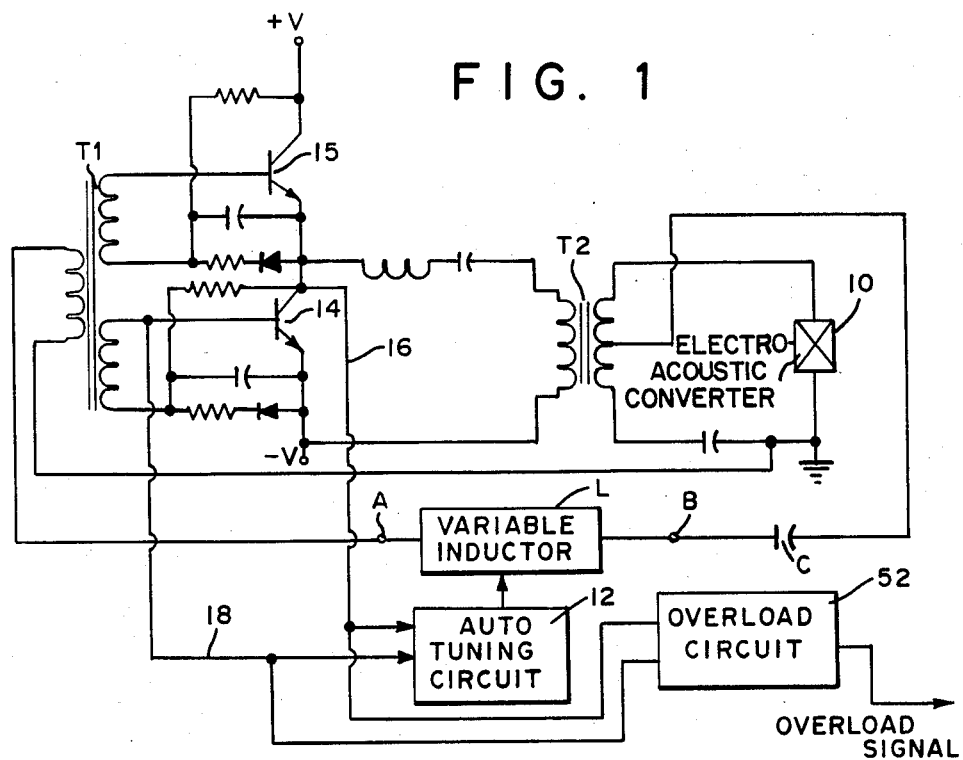
FIG. 1 is a schematic electrical circuit diagram of a power supply, including automatic tuning and overload circuits, for driving an electroacoustic converter.

Referring now to the drawings and FIG. 1 in particular, there is shown a schematic electrical circuit diagram of a power supply oscillatory circuit for energizing an electroacoustic converter 10. The converter 10 when suitably energized provides mechanical vibratory (ultrasonic) energy at a predetermined frequency, usually in the frequency range between 1 kHz and 100 kHz. Typically, a frequency of 20 kHz or 40 kHz is used. Power supply circuits for energizing converters are well known in the art, see, for instance, U.S. Pat. No. 3,432,691 issued to A. Shoh, entitled "Oscillatory Circuit for Electro-Acoustic Converter", dated Mar. 11, 1969.

In order to provide optimum operation, a variable inductor L and a capacitor C are provided in the feedback loop from output transformer T2 to input transformer T1. By proper adjustment of the electrical inductance of the inductor L the oscillatory circuit will be tuned to the precise predetermined frequency of the converter 10. The inductor and capacitor may be connected in series as shown or in parallel as is also well known in the art. Heretofore the inductor L typically was mechanically adjusted by means of a screw adjustment on the control panel of an ultrasonic apparatus. In the present invention an automatic tuning circuit 12 is provided for automatically adjusting by means of an adjustment signal the inductance of inductor L for providing optimum tuned operation. The automatic tuning circuit will be described in detail below.

A switching transistor 14 comprising a portion of the oscillatory circuit for energizing the converter 10 has its collector voltage coupled via conductor 16 and its base voltage coupled via conductor 18 to the automatic tuning circuit 12. The base voltage is related to the state of the transistor 14 and hence to the collector current flowing through the transistor. A portion of the signal provided at the output windings of transformer T2 energizing the converter 10 is fed back via a feedback loop, which includes a series connected variable inductor L and capacitor C, to an input winding of transformer T1. By suitably adjusting the inductance of inductor L until proper phasing of the collector voltage and collector current of transistor 14 is achieved, the switching of transistors 14 and 15 occurs at optimum circuit efficiency.

Figure 2:
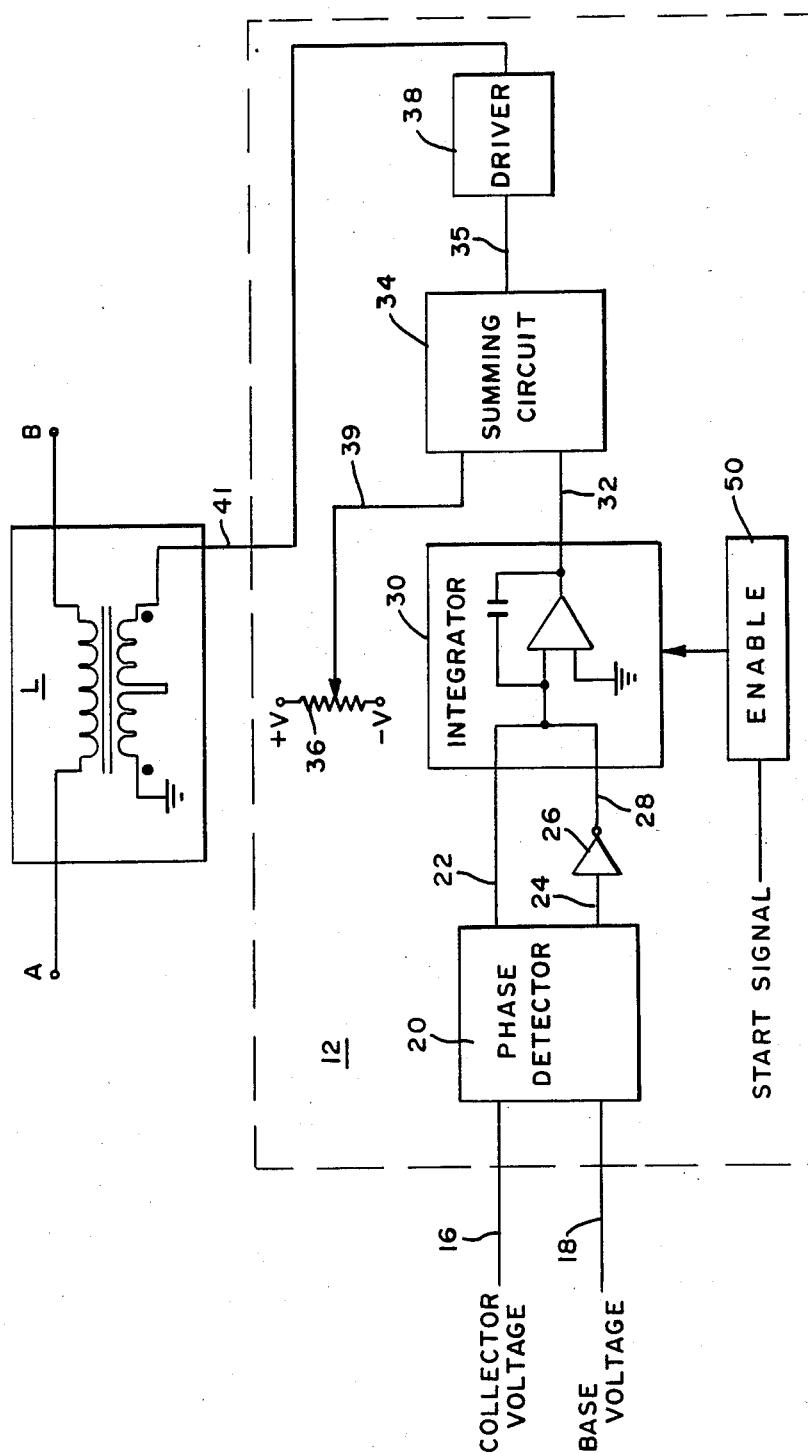
FIG. 2 is a schematic electrical circuit diagram of the automatic tuning circuit comprising a preferred embodiment of the present invention.

The manner of automatically adjusting the inductance of inductor L is performed as described hereinafter with reference to FIG. 2. The square wave collector voltage signal and square wave base voltage signal of transistor 14 are provided to a phase detector circuit 20. Depending upon the phase relation (i.e., the direction of the phase difference) between the two mentioned voltage signals positive pulses will appear on either conductor 22 or 24. For instance, if the collector voltage signal leads in phase in relation to the base voltage signal, pulses will be manifest on conductor 22 having a pulse width commensurate with the phase difference between the two input signals. Alternatively, if the collector voltage signal lags in phase in relation to the base voltage signal, pulses will be manifest on conductor 24 having a pulse width commensurate with the phase difference. The phase detector circuit 20 may be of the general type described in the article entitled "A 3-State Phase Detector can Improve your Next PLL Design" by C. A. Sharpe, appearing in EDN magazine, Sept. 20, 1976 on pages 55 to 59.

The phase difference responsive signal on conductor 24 is provided to the input of an inverter 26 for providing corresponding negative pulses on conductor 28. The conductors 22 and 28 are both connected to a respective input of an integrator circuit 30. Depending upon the presence of positive going leading phase pulses on conductor 22 or negative going lagging phase pulses on conductor 28 the output of integrator 30 along conductor 32 will be a positive or a negative direct current control signal. The amplitude of the control signal is proportional to the pulse width of the input pulses, i.e. the phase difference between the collector voltage signal and base voltage signal and the polarity of the control signal is dependent upon whether pulses are present along conductor 22 or conductor 28 and hence, is a function of the leading or lagging of the phase of the collector voltage signal in relation to the base voltage signal.

The control signal manifest at the output of integrator 30 is provided by conductor 32 to input of a summing circuit 34. A potentiometer 36 is adjusted to provide a signal at its wiper arm and along conductor 39 to a second input of the summing circuit 34. The wiper arm of the potentiometer 36 is adjusted for providing a nominal direct current voltage value along conductor 39 to cause, when the collector voltage signal and base voltage signal are in phase, the inductor L to have a nominal inductance for properly tuning the oscillatory circuit. The potentiometer 36 is adjusted during manufacture to tune the circuit for the predetermined frequency of the converter and horn assembly. Any variation from the nominal value will be automatically adjusted by the automatic tuning circuit.

Figure 3:
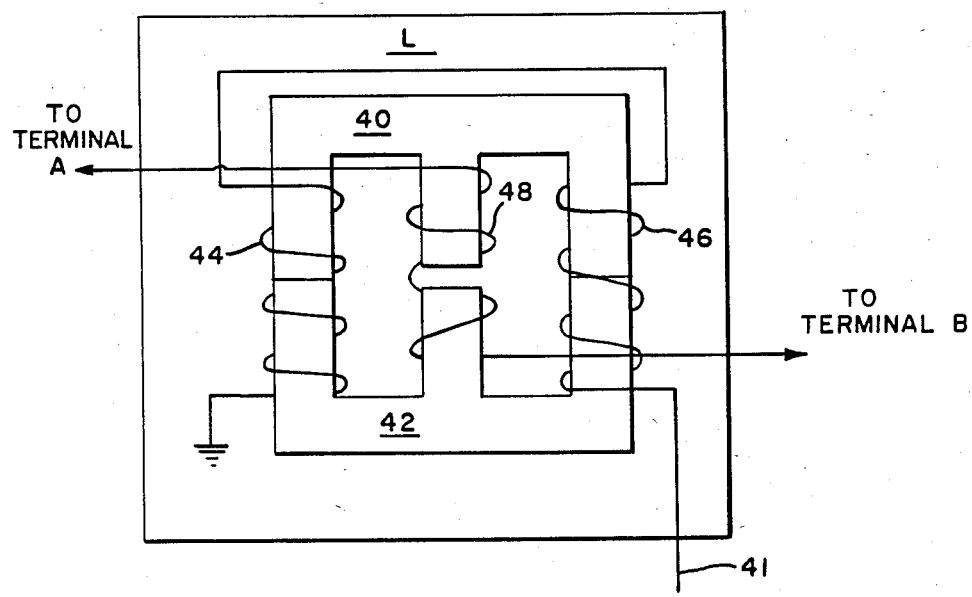
FIG. 3 is a schematic representation of a preferred embodiment of an electrically variable inductor.

The output signal from the summing circuit 34 is provided via conductor 35 to the input of a driver circuit 38. The output signal from driver circuit 38 along conductor 41 is used to adjust the inductance of electrically controllable inductor L as best described with reference to FIG. 3.

The electrically controllable inductor L comprises a pair of E-shaped cores 40 and 42 with respective pairs of outer legs in juxtaposition and having a small air gap between the respective center legs of the cores. A pair of coil windings 44 and 46 are wound around the respective outer legs of the core and connected in series. One end of the serially connected pair of coil windings 44 and 46 is connected to ground potential. The other end of the serially connected windings is connected to the output of driver circuit 38.

A coil winding 48 terminating in terminals A and B is disposed around the center leg of the core. In response to the adjustment signal from driver circuit 38, the flux in the E-shaped cores 40 and 42 varies and hence the inductance L manifest at terminals A and B is adjusted.

Responsive to the adjustment of the inductor L in the feedback loop from the output of transformer T2 to the input of transformer T1 the phase of the feedback signal will be adjusted until the control signal from integrator 30 is zero upon which occurrence the oscillatory circuit it properly tuned. There is no requirement for a mechanically adjusted inductor since the described automatic tuning circuit will compensate for different converter and horn systems by automatically adjusting the inductance of the inductor L.

In order to allow the oscillatory circuit to commence operation when the power supply is initially turned on, an enable circuit 50 is provided. The enable circuit 50 is a flip-flop which is set when the power supply is turned-on, causing the control signal from integrator 30 along conductor 32 to be zero. After a short time period, approximately 50 milliseconds, the enable circuit resets and the oscillatory circuit commences operation with the feedback loop included for automatically adjusting the inductance of L to its proper value.

In operation, both the collector voltage signal and base voltage signal of transistor 14 are provided via respective conductors 16 and 18 to phase detector 20. Depending upon the relative phase of the two electrical voltage signals, positive going pulses having a pulse width commensurate with the phase difference of the two signals will be manifest either along conductor 22 or 24. The positive going pulses along conductor 24 are converted by inverter 26 to negative going pulses. The output of the phase detector 20 along conductor 22 or the output of inverter 26 along conductor 28 are both provided to the integrator 30. The integrator 30 provides a direct current control signal having an amplitude porportional to the pulse width of the input pulse, i.e., the phase difference between the collector voltage signal and the base voltage signal, and having a polarity dependent upon the direction of the phase difference, that is, which one of the two mentioned voltage signals is leading the other. The control signal is summed with a nominal value signal from potentiometer 36 in summing circuit 34. The output of the summing circuit 34 is fed to driver circuit 38 and thence to coil windings 44 and 46. During operation at the predetermined frequency and at the same phase, the control signal along conductor 32 is zero. When the control signal is zero, the output of the summing circuit 34 is proportional only to the nominal signal provided from potentiometer 36. The driver circuit 38 provides the proper adjustment signal along conductor 41 for causing the inductance at terminals A and B to assume the nominal value. If there is a lead or lag relationship between the collector voltage signal and base voltage signal, the flux in the cores 40, 42 will change and hence the value of the inductance manifest at terminals A and B will be adjusted to eliminate the lead or lag phase relation. Hence, the adjustment provided is automatic and continuous, requiring no mechanical adjustment by an operator.

Since the oscillatory circuit may become locked to a converter at a resonant frequency other than the predetermined frequency, an overload circuit 52 such as the overload circuit described in the patent to Quist supra which monitors the collector voltage signal and base voltage signal of transistor 14 may be included to turn off the power supply in the event of an overload condition or operation at a frequency other than the predetermined frequency.

While there has been described and illustrated an automatic tuning circuit for an oscillatory circuit used for energizing an electroacoustic converter in an ultrasonic apparatus, it will be apparent to those skilled in the art that modifications and variations may be made without deviating from the broad principle of the invention which shall be limited solely by the scope of the appended claims.

What is claimed is:

1. A power supply circuit for driving an electroacoustic converter comprising an oscillatory circuit including switching means for providing at an output a high frequency electrical signal at a predetermined frequency for energizing an electroacoustic converter wherein the improvement comprises:
   a feedback loop including an electrically variable inductance means coupled between the output and an input of said oscillatory circuit for providing a portion of said high frequency electrical signal at the output of said oscillatory circuit to an input of said oscillatory circuit, and
   an automatic tuning circuit coupled to said switching means and said variable inductance means for receiving a first signal commensurate with the voltage across said switching means and a second signal commensurate with the current through said switching means, and providing an adjustment signal responsive to said first and second signals to said variable inductance means for adjusting the inductance thereof from a nominal value to a value to cause said first signal and said second signal to be in phase with each other.

2. A power supply circuit as set forth in claim 1, said automatic tuning circuit including:
   phase detector means for providing a control signal indicative of the magnitude of the phase difference and the phase relation between said first signal and said second signal;
   means for providing a nominal inductance value signal;
   summing means coupled for receiving said control signal and said nominal inductance value signal and providing an output signal commensurate with the sum of said control signal and said nominal inductance value signal, and
   driving means coupled for receiving said output signal from said summing means and providing said adjustment signal for adjusting the inductance of said variable inductance means responsive to said output signal from said summing means.

3. A power supply circuit as set forth in claims 1 or 2, said variable inductance means comprising:
   a pair of E-shaped cores disposed for providing an air gap between one pair of respective legs of said cores and the other pairs of legs being in end to end relation;
   a pair of serially connected coil windings disposed about the responsive end to end leg portions of said E-shaped cores, one end of said serially connected coil windings beings connected to ground potential and the other end of said serially connected coil windings being coupled to receive said adjustment signal from said automatic tuning circuit, and
   a third coil winding disposed about the remaining legs of said cores and over said air gap, the ends of the third coil being terminals of said variable inductance means, the inductance of said third coil winding being adjustd responsive to said adjustment signal from said automatic tuning circuit.

4. A power supply as set forth in claim 1, said switching means being a transistor, said first signal being the collector voltage signal of said transistor and said second signal being the base voltage signal of said transistor.

5. A power supply as set forth in claim 1, and further including overload circuit means for turning off said oscillatory circuit when the oscillatory circuit is operating at a frequency other than said predetermined frequency.

* * * * *